United States Patent

Suzuki et al.

(10) Patent No.: US 9,859,411 B2
(45) Date of Patent: Jan. 2, 2018

(54) FIELD EFFECT TRANSISTOR

(71) Applicant: SHARP KABUSHIKI KAISHA, Sakai, Osaka (JP)

(72) Inventors: Takamitsu Suzuki, Sakai (JP); Masaya Isobe, Sakai (JP); Masaru Kubo, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 43 days.

(21) Appl. No.: 15/306,713

(22) PCT Filed: Feb. 20, 2015

(86) PCT No.: PCT/JP2015/054866
§ 371 (c)(1),
(2) Date: Oct. 25, 2016

(87) PCT Pub. No.: WO2015/178050
PCT Pub. Date: Nov. 26, 2015

(65) Prior Publication Data
US 2017/0077276 A1    Mar. 16, 2017

(30) Foreign Application Priority Data

May 21, 2014 (JP) ................................. 2014-105532

(51) Int. Cl.
*H01L 29/423* (2006.01)
*H01L 29/778* (2006.01)
(Continued)

(52) U.S. Cl.
CPC .......... *H01L 29/778* (2013.01); *H01L 23/528* (2013.01); *H01L 23/64* (2013.01); *H01L 29/205* (2013.01); *H01L 29/41758* (2013.01); *H01L 29/4238* (2013.01); *H01L 29/7786* (2013.01); *H01L 29/78* (2013.01); *H01L 29/786* (2013.01);
(Continued)

(58) Field of Classification Search
CPC ......... H01L 29/42372; H01L 29/42376; H01L 29/4238; H01L 29/435; H01L 29/66318; H01L 23/5228; H01L 23/64; H01L 23/647; H01L 29/7786; H01L 29/7787
See application file for complete search history.

(56) References Cited

U.S. PATENT DOCUMENTS 5,170,235 A  12/1992 Tanino
2011/0284928 A1  11/2011 Shibata et al.
(Continued)

FOREIGN PATENT DOCUMENTS

JP  4-103138 A  4/1992
JP  5-304176 A  11/1993
(Continued)

*Primary Examiner* — Matthew Landau
*Assistant Examiner* — Scott Stowe
(74) *Attorney, Agent, or Firm* — Birch, Stewart, Kolasch & Birch, LLP

(57) ABSTRACT

A field-effect transistor (a GaN-based HFET) includes a gate electrode, a gate electrode pad, a first wiring line connecting one end of the gate electrode and the gate electrode pad, a second wiring line connecting the other end of the gate electrode and the gate electrode pad, and a resistance element that is connected to the first wiring line and is capable of adjusting the impedance of the first wiring line.

9 Claims, 6 Drawing Sheets

(51) Int. Cl.
*H01L 29/78* (2006.01)
*H01L 29/786* (2006.01)
*H01L 23/528* (2006.01)
*H01L 23/64* (2006.01)
*H01L 29/205* (2006.01)
*H01L 29/417* (2006.01)
*H01L 29/20* (2006.01)
*H01L 29/40* (2006.01)
*H01L 29/45* (2006.01)

(52) U.S. Cl.
CPC ........ *H01L 29/2003* (2013.01); *H01L 29/402* (2013.01); *H01L 29/42376* (2013.01); *H01L 29/452* (2013.01)

(56) References Cited

U.S. PATENT DOCUMENTS

| | | | |
|---|---|---|---|
| 2012/0012908 A1 | 1/2012 | Matsunaga | |
| 2012/0112832 A1* | 5/2012 | Kawano | H03F 3/72 330/124 D |
| 2012/0199847 A1* | 8/2012 | Takagi | H01L 29/0696 257/77 |

FOREIGN PATENT DOCUMENTS

| | | |
|---|---|---|
| JP | 6-87505 B2 | 11/1994 |
| JP | 9-8063 A | 1/1997 |
| JP | 2010-186925 A | 8/2010 |
| WO | WO 2010/113779 A1 | 10/2010 |

\* cited by examiner 52   53  51   55   56

FIELD EFFECT TRANSISTOR

TECHNICAL FIELD

The present invention relates to GaN-based field-effect transistors.

BACKGROUND ART

In the past, as a GaN-based field-effect transistor, there has been a GaN-based field-effect transistor described in PTL 1 (Japanese Unexamined Patent Application Publication No. 2010-186925). As depicted in FIG. 5, this field-effect transistor includes drain electrodes 51, source electrodes 52, gate electrodes 53, a gate electrode pad 54, a gate wiring line 55, and a resistance element 56. A plurality of gate electrodes 53 are provided like fingers, and the gate wiring line 55 connected to one end side of each gate electrode 53 is connected to the gate electrode pad 54 via the resistance element 56. Then, when the field-effect transistor is used as a switching device, the resistance element 56 suppresses the occurrence of ringing and a surge voltage.

Moreover, in the past, as a field-effect transistor, there has been a field-effect transistor described in PTL 2 (Japanese Examined Patent Application Publication No. 6-87505). As depicted in FIG. 6, this field-effect transistor includes a plurality of gate electrodes 61 formed like fingers, a gate lead-out electrode portion 62 connected to one end side of each gate electrode 61, and a gate electrode pad 63 connected to the gate lead-out electrode portion 62. Into a side of each gate electrode 61 where the gate lead-out electrode portion 62 is located, a stabilizing resistance 64 is inserted. This stabilizing resistance 64 achieves a uniform operation of the field-effect transistor.

CITATION LIST

Patent Literature

PTL 1: Japanese Unexamined Patent Application Publication No. 2010-186925
PTL 2: Japanese Examined Patent Application Publication No. 6-87505

SUMMARY OF INVENTION

Technical Problem

However, in the field-effect transistors of PTL 1 and PTL 2, the gate electrode pad is connected to only one end side of each gate electrode. As a result, when the field-effect transistor is used as a switching device, a signal delay occurs in the field-effect transistor, which makes it impossible for the field-effect transistor to perform a uniform operation. Thus, it is impossible to suppress ringing and a surge voltage sufficiently and implement a stabile operation of the field-effect transistor.

Therefore, an object of the present invention is to provide a field-effect transistor that can suppress ringing and a surge voltage sufficiently and implement a stable operation.

Solution to Problem

To solve the above-described problem, a field-effect transistor of the present invention includes:
a GaN-based stacked body having a heterojunction;
a drain electrode that is formed on the GaN-based stacked body so as to extend in a first direction;
a source electrode that is formed on the GaN-based stacked body so as to extend in the first direction and is formed with a predetermined interval left between the drain electrode and the source electrode in a second direction intersecting the first direction;
a gate electrode formed between the drain electrode and the source electrode in a plan view;
an insulating layer formed on the GaN-based stacked body so as to cover the gate electrode;
a gate electrode pad formed on the insulating layer;
a first wiring line connecting one end of the gate electrode and the gate electrode pad;
a second wiring line connecting the other end of the gate electrode and the gate electrode pad; and
an impedance adjusting portion that is capable of adjusting the impedance of at least one wiring line of the first wiring line and the second wiring line.

Moreover, in the field-effect transistor of an embodiment, the impedance adjusting portion is a resistance element provided in at least one wiring line of the first wiring line and the second wiring line.

Furthermore, in the field-effect transistor of an embodiment, the drain electrode, the source electrode, and the impedance adjusting portion are formed of ohmic metals.

In addition, in the field-effect transistor of an embodiment, the impedance adjusting portion is formed of part of at least one wiring line of the first wiring line and the second wiring line.

Moreover, in the field-effect transistor of an embodiment, a plurality of the drain electrodes and a plurality of the source electrodes are alternately disposed in substantially parallel with each other at intervals in the second direction and extend like fingers in the first direction.

Advantageous Effects of Invention

With the field-effect transistor of the present invention, it is possible to achieve a uniform operation, suppress ringing and a surge voltage sufficiently, and implement a stable operation of the field-effect transistor.

DESCRIPTION OF EMBODIMENTS

Figure 1:
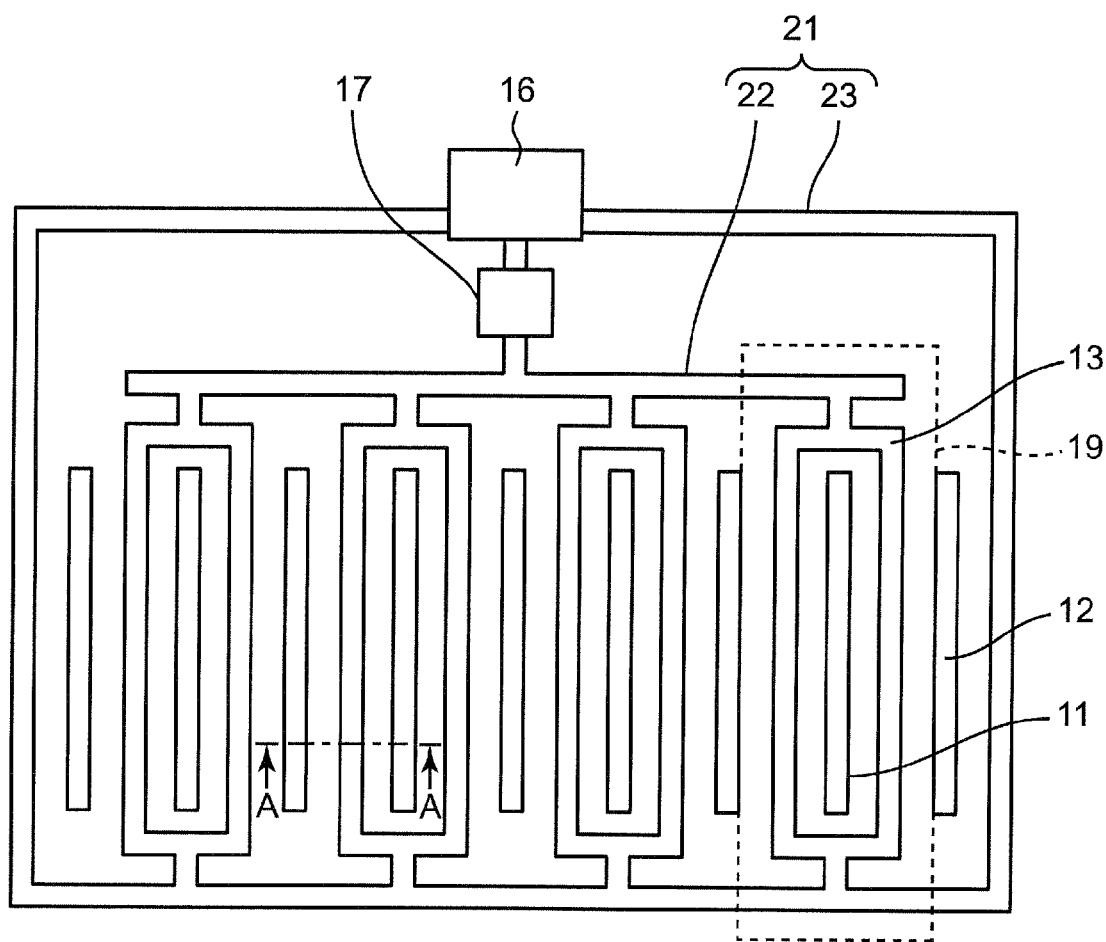
FIG. 1 is a schematic plan view of a GaN-based field-effect transistor of a first embodiment of the present invention.

Hereinafter, the present invention will be described in detail by using embodiments depicted in the drawings.

(First Embodiment)

FIG. 1 is a schematic plan view of a GaN-based heterojunction field-effect transistor (HFET) which is a first embodiment of the present invention. Moreover, FIG. 2 is a sectional view depicting a cross section taken on the line A-A of FIG. 1.

Figure 2:
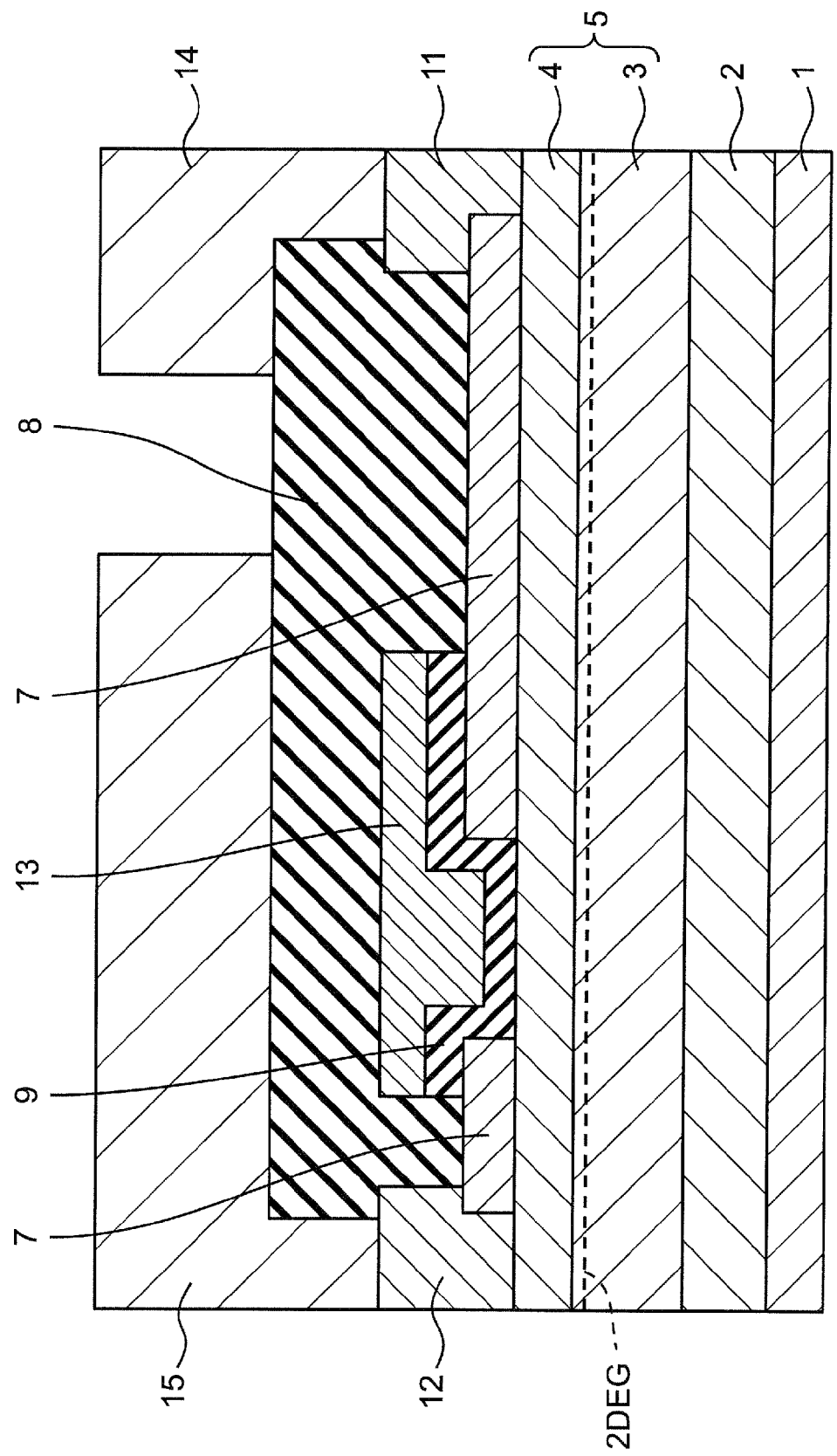
FIG. 2 is a sectional view depicting a cross section taken on the line A-A of FIG. 1.

As depicted in FIG. 2, in the first embodiment, a buffer layer 2, a GaN layer 3, and an AlGaN layer 4 are formed on a Si substrate 1 in order. The GaN layer 3 and the AlGaN layer 4 form a GaN-based stacked body 5 having a heterojunction. Two-dimensional electron gas (2DEG) is generated at the interface between the GaN layer 3 and the AlGaN layer 4, whereby a channel is formed. Incidentally, the above-described substrate is not limited to the Si substrate and a sapphire substrate or a SiC substrate may be used; the GaN-based stacked body 5 may be grown on the sapphire substrate or the SiC substrate, or the GaN-based stacked body 5 may be grown on a substrate formed of a nitride semiconductor such as growing an AlGaN layer on a GaN substrate. Moreover, the buffer layer 2 may not be formed on the Si substrate 1.

On the GaN-based stacked body 5, a protective film 7 and an interlayer dielectric 8 are formed in order. As the material of the protective film 7, for example, SiN is used here, but $SiO_2$, $Al_2O_3$, or the like may be used. Moreover, as the material of the interlayer dielectric 8, for example, a $SiO_2$ film formed by CVD is used here, but an insulating material such as spin on glass (SOG) or boron phosphorous silicate glass (BPSG) may be used. Furthermore, the film thickness of the SiN protective film 7 is set at 150 nm here as an example, but the film thickness of the SiN protective film 7 may be set in the 20- to 250-nm range.

In the protective film 7 and the interlayer dielectric 8, recesses that pass through the protective film 7 and the interlayer dielectric 8 and reach the AlGaN layer 4 are formed, and, in these recesses, a drain ohmic electrode 11 and a source ohmic electrode 12 are formed. The drain ohmic electrode 11 and the source ohmic electrode 12 are each an ohmic electrode formed of ohmic metals; specifically, a Ti/Al/TiN electrode formed of a Ti layer, an Al layer, and a TiN layer which are stacked in order. Here, an Al film thickness is from 10 to 300 nm.

To the drain ohmic electrode 11, a drain electrode portion 14 is connected via a via hole formed in the interlayer dielectric 8. To the source ohmic electrode 12, a source electrode portion 15 is connected via a via hole formed in the interlayer dielectric 8. The drain electrode portion 14 and the source electrode portion 15 are each formed as a Ti/AlCu/TiN electrode formed of a Ti layer, an AlCu layer, and a TiN layer which are stacked in order. Here, an AlCu film thickness is from 1000 to 3000 nm.

In the protective film 7 between the drain ohmic electrode 11 and the source ohmic electrode 12, an opening is formed. In this opening and an area near this opening, a gate insulating film 9 and a gate electrode 13 are formed. The interlayer dielectric 8 covers the gate electrode 13. On the interlayer dielectric 8, a gate electrode pad (which is not depicted in the drawing) is formed. The gate insulating film 9 is a SiN film. The gate electrode 13 is formed of TiN.

As depicted in FIG. 1, the drain ohmic electrode 11 and the source ohmic electrode 12 extend like fingers in a first direction, and a plurality of drain ohmic electrodes 11 and a plurality of source ohmic electrodes 12 are alternately disposed in substantially parallel with each other at predetermined intervals in a second direction which is substantially orthogonal to the first direction. Incidentally, in FIG. 1, the interlayer dielectric 8, the drain electrode portion 14, and the source electrode portion 15 are omitted.

In a plan view, the gate electrode 13 extends in the first direction between the finger-like drain ohmic electrode 11 and the finger-like source electrodes 12 and extends in the form of a ring so as to surround the drain ohmic electrode 11.

Each of both ends of the gate electrode 13 in the first direction is connected to a gate electrode pad 16 via a gate electrode connection wiring line 21. The gate electrode pad 16 is disposed on the side where one end of the gate electrode 13 in the first direction is located. The gate electrode connection wiring line 21 has a first wiring line 22 and a second wiring line 23. An example of the gate electrode connection wiring line 21 is a Ti/AlCu/TiN electrode formed of a Ti layer, an AlCu layer, and a TiN layer which are stacked in order.

The drain ohmic electrode 11, the gate electrode 13 surrounding this drain ohmic electrode 11, part of the first wiring line 22, and part of the second wiring line 23 form a gate finger 19. The GaN-based HFET has a plurality of gate fingers 19 disposed in the second direction.

The first wiring line 22 is connected to one end of each gate electrode 13 in the first direction and is connected to the gate electrode pad 16, thereby electrically connecting the one end of each gate electrode 13 and the gate electrode pad 16. To the first wiring line 22, one resistance element 17, which is an example of an impedance adjusting portion, is connected.

The second wiring line 23 is connected to the other end of each gate electrode 13 in the first direction and is connected to the gate electrode pad 16, thereby electrically connecting the other end of each gate electrode 13 and the gate electrode pad 16.

The resistance element 17 is located between one end of each gate electrode 13 and the gate electrode pad 16. The resistance element 17 is formed of ohmic metals; specifically, a Ti/Al/TiN electrode formed of a Ti layer, an Al layer, and a TiN layer which are the same layers as those of the drain ohmic electrodes 11 and the source ohmic electrodes 12 and are stacked in order. The resistance element 17 is an adjustment resistance whose resistance value can be adjusted and makes it possible to adjust the impedance of the first wiring line 22 including the resistance element 17. Specifically, the sheet resistance value of the resistance element 17 is set such that the CR time constant of the first wiring line 22 including the resistance element 17 and the CR time constant of the second wiring line 23 become substantially identical with each other. The sheet resistance value of the resistance element 17 is about ten times larger than the sheet resistance value of the gate electrode connection wiring line 21, for example.

The GaN-based HFET of this embodiment allows the resistance element 17 to adjust the impedance of the first wiring line 22 including the resistance element 17. As a result, by adjusting the impedance of the first wiring line 22 for a gate signal by using the resistance element 17, it is possible to make the CR time constant of the first wiring line 22 and the CR time constant of the second wiring line 23 substantially identical with each other. This makes it possible to prevent a signal delay from occurring in the GaN-based HFET.

Therefore, with a simple configuration in which the impedance of the first wiring line 22 is simply adjusted by the resistance element 17, it is possible to achieve a uniform operation of the GaN-based HFET, suppress ringing and a surge voltage sufficiently, and implement a stable operation of the GaN-based HFET.

Moreover, in this embodiment, since the drain ohmic electrodes 11, the source ohmic electrodes 12, and the resistance element 17 are formed of the same ohmic metals, it is possible to form the drain electrodes 11, the source electrodes 12, and the resistance element 17 in the same process. As a result, there is no need to add another process and perform masking to provide the resistance element 17, which makes it possible to reduce the production cost.

Furthermore, in this embodiment, the plurality of drain ohmic electrodes 11 and source ohmic electrodes 12 extending like fingers as described above are provided. As a result, it is possible to pass a large current through the GaN-based HFET, which makes it possible to achieve a uniform operation, suppress ringing and a surge voltage sufficiently, and implement a stable operation of the GaN-based HFET even when a large current is passed therethrough.

(Second Embodiment)

Figure 3:
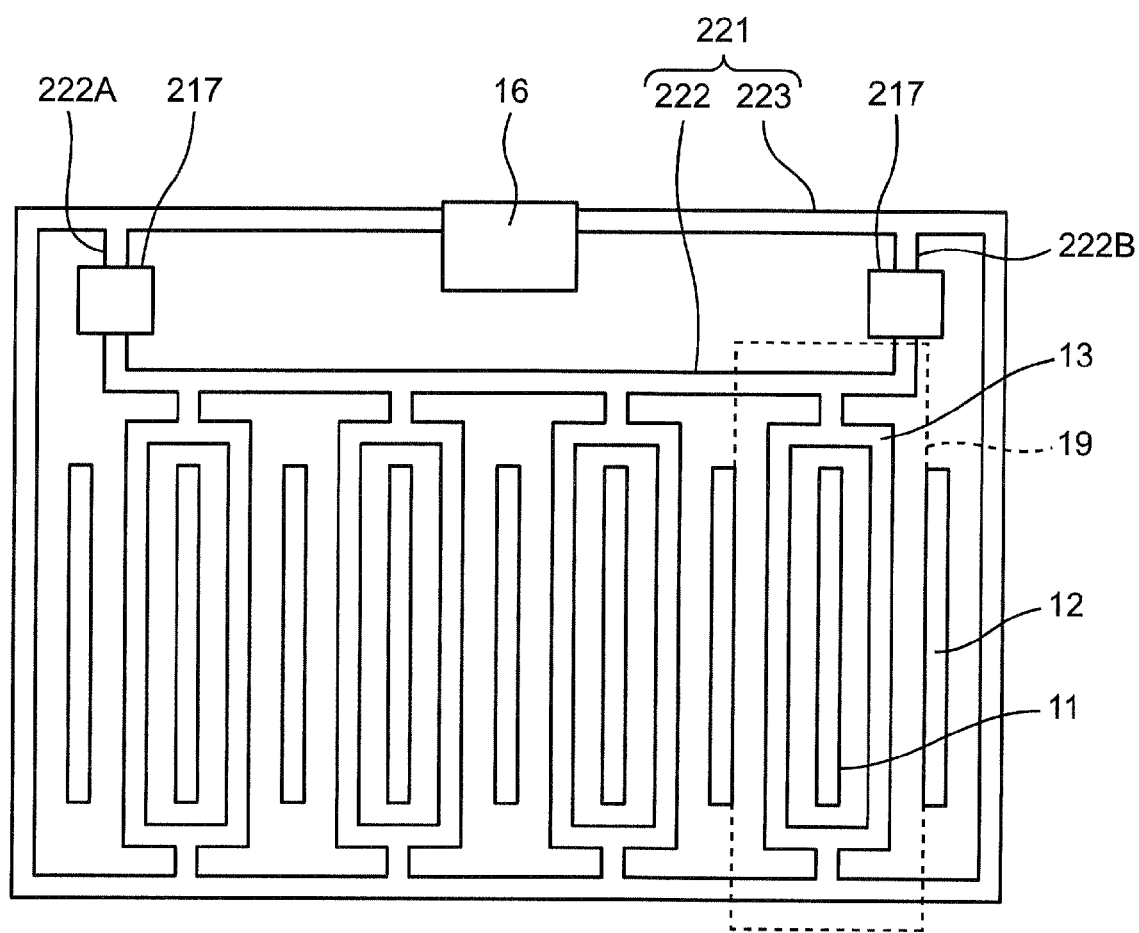
FIG. 3 is a schematic plan view of a GaN-based field-effect transistor of a second embodiment of the present invention.

FIG. 3 is a schematic plan view of a GaN-based HFET of the second embodiment. The following is a difference from the above-described first embodiment: in the second embodiment, two resistance elements 217 and 217 are connected to a first wiring line 222 of a gate electrode connection wiring line 221. Incidentally, in the second embodiment, since the same reference characters as those of the above-described first embodiment denote the same configurations as those of the above-described first embodiment, explanations thereof will be omitted.

As depicted in FIG. 3, each of both ends of the first wiring line 222 of the gate electrode connection wiring line 221 is connected to the gate electrode pad 16 via part of a second wiring line 223 of the gate electrode connection wiring line 221. To both ends 222A and 222B of the first wiring line 222, the resistance elements 217 and 217 are connected. The sheet resistance value of the resistance elements 217 and 217 is set such that the CR time constant of the first wiring line 222 and the CR time constant of the second wiring line 223 become substantially identical with each other.

In the GaN-based HFET of this embodiment, part of the first wiring line 222 and part of the second wiring line 223 overlap one another. As a result, as compared to a case in which the first wiring line 222 and the second wiring line 223 do not overlap one another, it is possible to further reduce the difference between the CR time constant of the first wiring line 222 and the CR time constant of the second wiring line 223 and prevent the occurrence of a signal delay in the GaN-based HFET more reliably. Therefore, it is possible to make the GaN-based HFET operate more uniformly and suppress ringing and a surge voltage.

(Third Embodiment)

Figure 4:
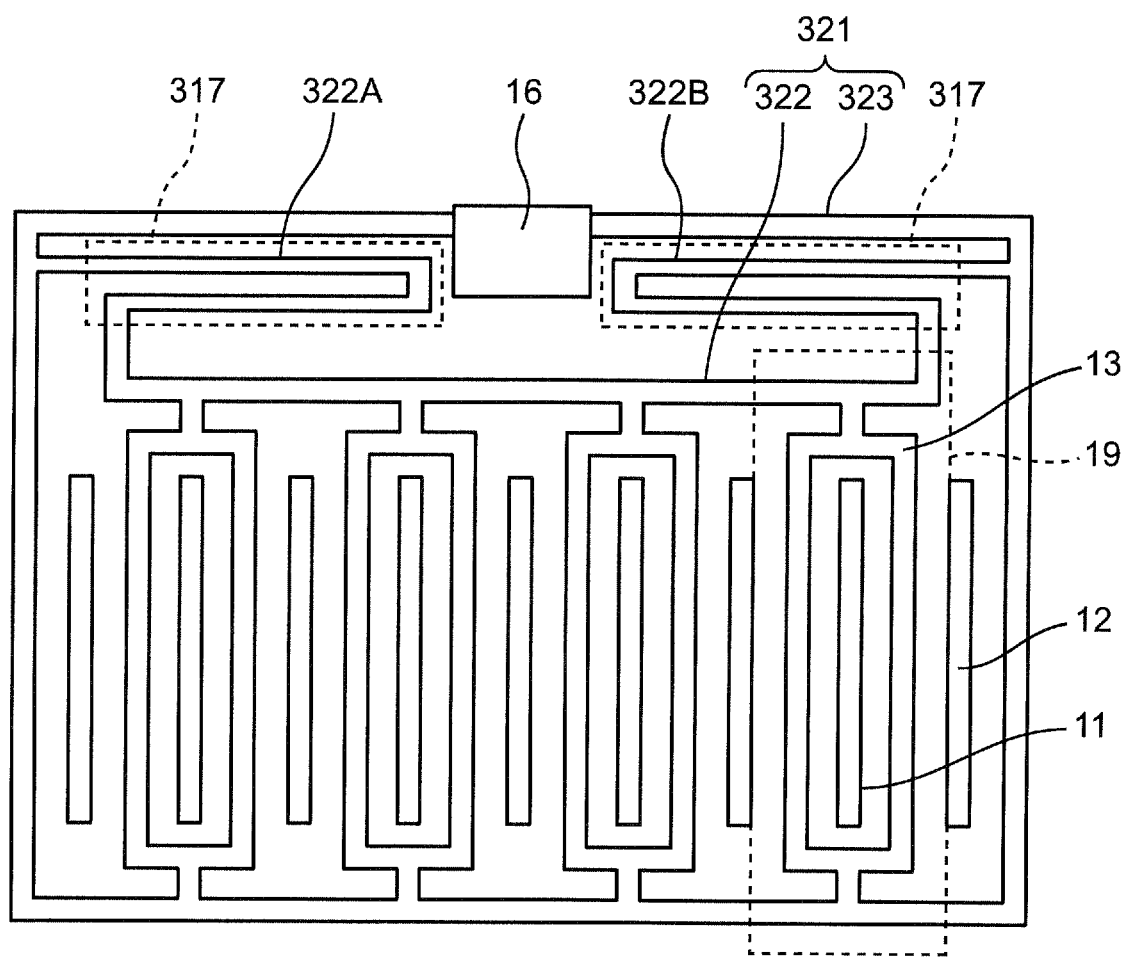
FIG. 4 is a schematic plan view of a GaN-based field-effect transistor of a third embodiment of the present invention.
Figure 5:
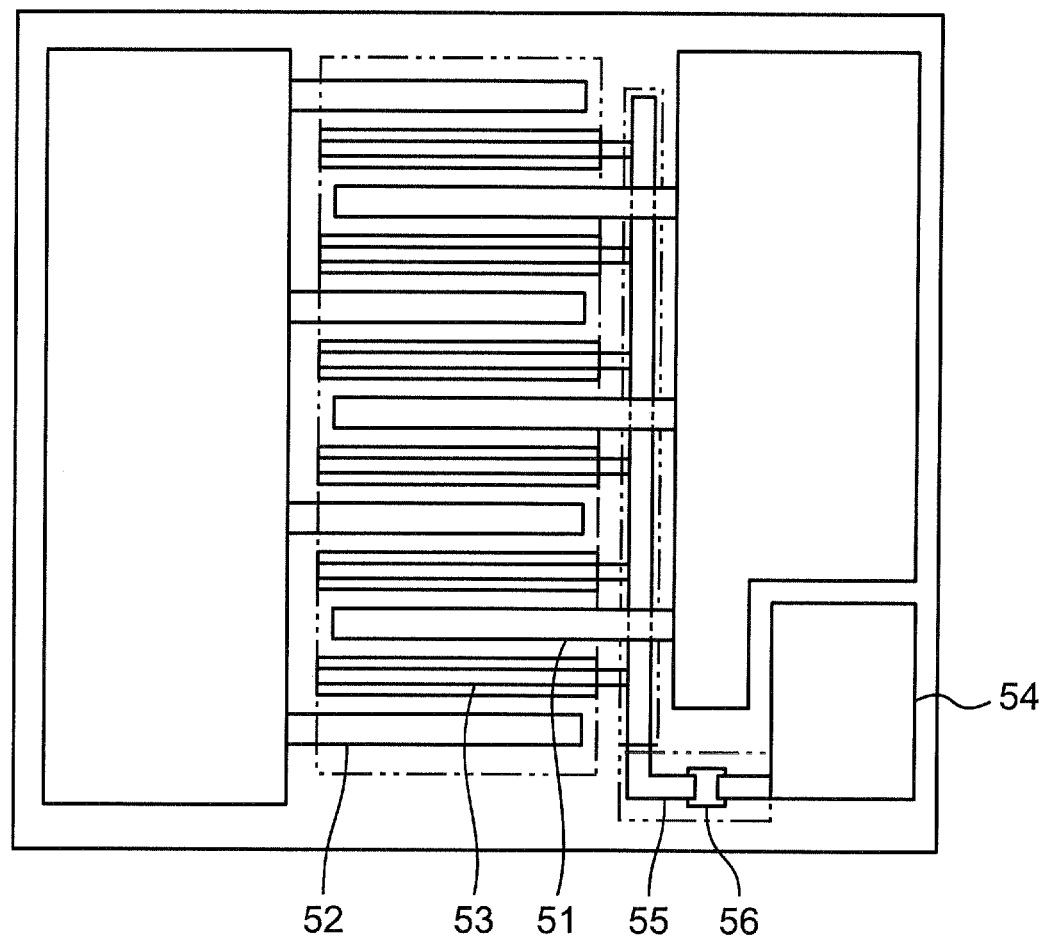
FIG. 5 is a schematic plan view of an existing GaN-based field-effect transistor.
Figure 6:
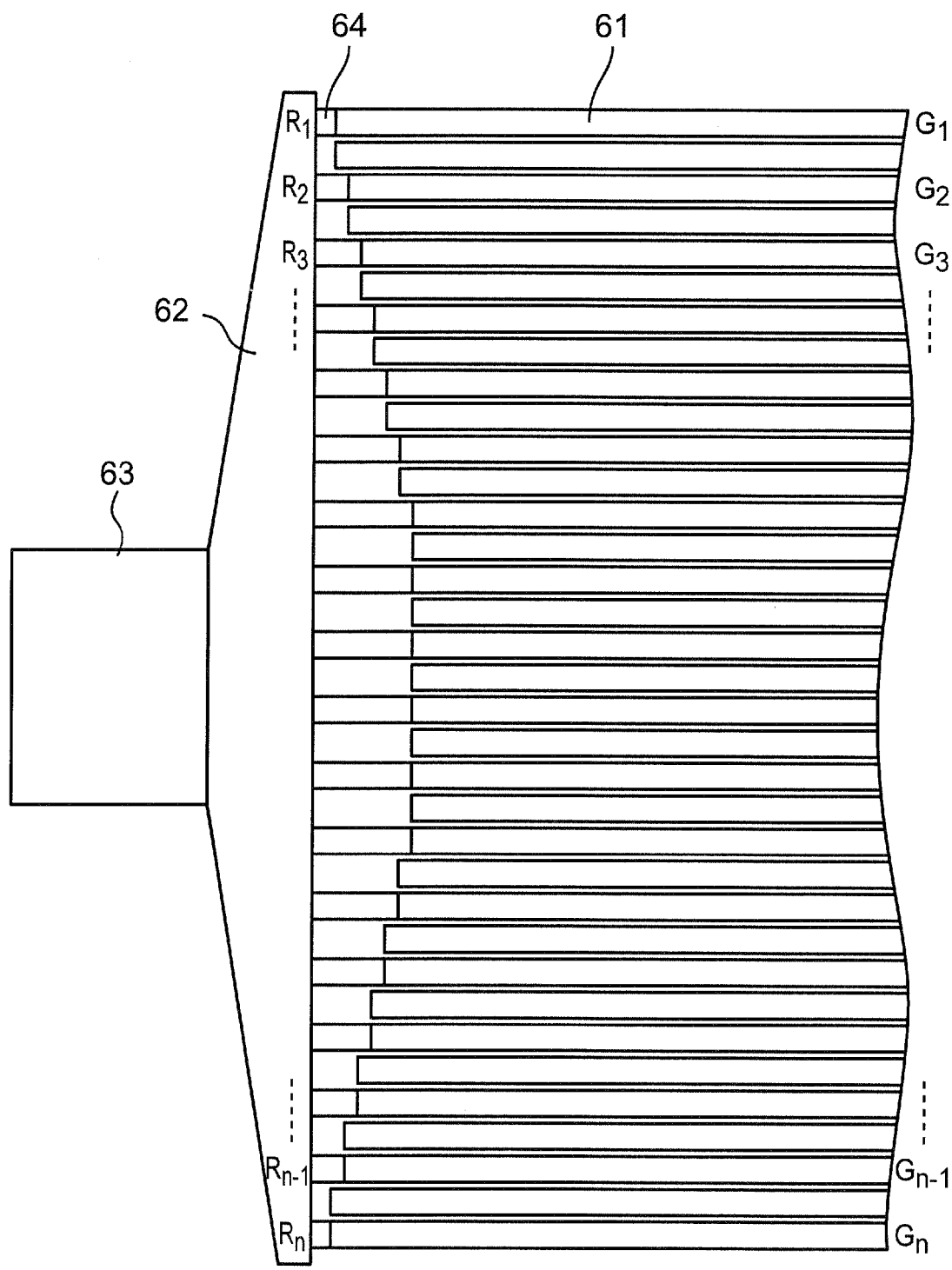
FIG. 6 is a schematic plan view of another existing GaN-based field-effect transistor.

FIG. 4 is a schematic plan view of a GaN-based HFET of the third embodiment. The following is a difference from the above-described first embodiment: in the third embodiment, a resistance element is not connected to a first wiring line 322 of a gate electrode connection wiring line 321 and both ends 322A and 322B of the first wiring line 322 form an impedance adjusting portion. Incidentally, in the third embodiment, since the same reference characters as those of the above-described first embodiment denote the same configurations as those of the above-described first embodiment, explanations thereof will be omitted.

As depicted in FIG. 4, both ends of the first wiring line 322 of the gate electrode connection wiring line 321 are connected to a second wiring line 323 of the gate electrode connection wiring line 321. The both ends 322A and 322B of the first wiring line 322 are formed so as to meander. The CR time constant of the first wiring line 322 and the CR time constant of the second wiring line 323 are set so as to be substantially identical with each other by the resistance or the like of the both ends 322A and 322B of the first wiring line 322. That is, the both ends 322A and 322B of the first wiring line 322 form an impedance adjusting portion 317.

In the GaN-based HFET of this embodiment, since the both ends 322A and 322B of the first wiring line 322 form the impedance adjusting portion 317, there is no need to provide a resistance element or the like separately as an impedance adjusting portion. As a result, since there is no need to add another process, increase the area of a chip, and perform masking to provide a resistance element or the like, it is possible to reduce the production cost of the GaN-based HFET.

Incidentally, in the above-described first to third embodiments, a plurality of finger-like drain ohmic electrodes and a plurality of finger-like source ohmic electrodes are provided, but an embodiment is not limited thereto; a comb-like drain ohmic electrode and a comb-like source ohmic electrode may be provided instead.

Moreover, in the above-described first and second embodiments, the resistance elements 17 and 217 are connected to the first wiring lines 22 and 222, respectively, but an embodiment is not limited thereto; a resistance element may be connected also to a second wiring line or a resistance element may not be connected to a first wiring line and a resistance element may be connected only to a second wiring line.

Furthermore, in the above-described third embodiment, the both ends 322A and 322B of the first wiring line 322 form the impedance adjusting portion 317, but an embodiment is not limited thereto; part of a second wiring line may form an impedance adjusting portion or part of a first wiring line may not form an impedance adjusting portion and only part of a second wiring line may form an impedance adjusting portion.

In addition, in the above-described first and second embodiments, the resistance elements 17 and 217 are connected to the first wiring lines 22 and 222, respectively, but an embodiment is not limited thereto; a passive element, such as a capacitor, which can adjust the CR time constant of a wiring line may be connected to a first wiring line.

Moreover, in the above-described first to third embodiments, the GaN-based HFET has a plurality of gate fingers 19 disposed in the second direction, but an embodiment is not limited thereto; the GaN-based HFET may have one gate finger.

Specific embodiments of this invention have been described, but this invention is not limited to the embodiments described above and can be embodied by being modified in various ways within the scope of this invention.

The present invention and the embodiments can be summarized as follows.

A field-effect transistor of the present invention includes:
a GaN-based stacked body 5 having a heterojunction;
a drain electrode 11 that is formed on the GaN-based stacked body 5 so as to extend in a first direction;
a source electrode 12 that is formed on the GaN-based stacked body 5 so as to extend in the first direction and is formed with a predetermined interval left between the drain electrode 11 and the source electrode 12 in a second direction intersecting the first direction;
a gate electrode 13 formed between the drain electrode 11 and the source electrode 12 in a plan view;
an insulating layer 8 formed on the GaN-based stacked body 5 so as to cover the gate electrode 13;

a gate electrode pad 16 formed on the insulating layer 8;

a first wiring line 22, 222, 322 connecting one end of the gate electrode 13 and the gate electrode pad 16;

a second wiring line 23, 223, 323 connecting the other end of the gate electrode 13 and the gate electrode pad 16; and an impedance adjusting portion 17, 217, 317 that is capable of adjusting the impedance of at least one wiring line of the first wiring line 22, 222, 322 and the second wiring line 23, 223, 323.

With the field-effect transistor of the present invention, the impedance adjusting portion 17, 217, 317 can adjust the impedance of at least one wiring line of the first wiring line 22, 222, 322 and the second wiring line 23, 223, 323. As a result, by adjusting the impedance of the first wiring line 22, 222, 322 and the second wiring line 23, 223, 323 for a gate signal, the impedance caused by a resistance, a parasitic capacity, or the like, by using the impedance adjusting portion 17, 217, 317, the impedance of the first wiring line 22, 222, 322 and the impedance of the second wiring line 23, 223, 323 are made to be substantially identical with each other, whereby it is possible to prevent a signal delay from occurring in the field-effect transistor.

Thus, it is possible to allow the field-effect transistor to operate uniformly, suppress ringing and a surge voltage sufficiently, and implement a stable operation of the field-effect transistor.

Moreover, in the field-effect transistor of an embodiment, the impedance adjusting portion 17, 217 is a resistance element provided in at least one wiring line of the first wiring line 22, 222 and the second wiring line 23, 223.

According to the embodiment, the impedance adjusting portion 17, 217 is a resistance element provided in at least one wiring line of the first wiring line 22, 222 and the second wiring line 23, 223. As a result, this resistance element makes it possible to adjust an impedance with a simple structure such that the impedance of the first wiring line 22, 222 and the impedance of the second wiring line 23, 223 become substantially identical with each other.

Furthermore, in the field-effect transistor of an embodiment, the drain electrode 11, the source electrode 12, and the impedance adjusting portion 17, 217 are formed of ohmic metals.

According to the embodiment, since the drain electrode 11, the source electrode 12, and the impedance adjusting portion 17, 217 are formed of ohmic metals, it is possible to form the drain electrode 11, the source electrode 12, and the impedance adjusting portion 17, 217 in the same process. As a result, there is no need to add another process and perform masking to form the impedance adjusting portion 17, 217, which makes it possible to reduce the production cost.

In addition, in the field-effect transistor of an embodiment, the impedance adjusting portion 317 is formed of part of at least one wiring line of the first wiring line 322 and the second wiring line 323.

According to the embodiment, part of at least one wiring line of the first wiring line 322 and the second wiring line 323 forms the impedance adjusting portion 317. Thus, there is no need to provide a resistance element or the like separately as an impedance adjusting portion. As a result, since there is no need to add another process, increase the area of a chip, and perform masking to provide a resistance element or the like, it is possible to reduce the production cost of a GaN-based HFET.

Moreover, in the field-effect transistor of an embodiment, a plurality of the drain electrodes 11 and a plurality of the source electrodes 12 are alternately disposed in substantially parallel with each other at intervals in the second direction and extend like fingers in the first direction.

According to the embodiment, the plurality of drain electrodes 11 and source electrodes 12 extending like fingers are provided. As a result, it is possible to pass a large current through the field-effect transistor, which makes it possible to achieve a uniform operation, suppress ringing and a surge voltage sufficiently, and implement a stable operation of the field-effect transistor even when a large current is passed therethrough.

REFERENCE SIGNS LIST

5 GaN-based stacked body
8 interlayer dielectric
11 drain ohmic electrode
12 source ohmic electrode
13 gate electrode
16 gate electrode pad
17, 217 resistance element
317 impedance adjusting portion
22, 222, 322 first wiring line
23, 223, 323 second wiring line

The invention claimed is:

1. A field-effect transistor comprising:
a GaN-based stacked body having a heterojunction;
a drain electrode that is formed on the GaN-based stacked body so as to extend in a first direction;
a source electrode that is formed on the GaN-based stacked body so as to extend in the first direction, with a predetermined interval left between the drain electrode and the source electrode in a second direction intersecting the first direction;
a gate electrode formed between the drain electrode and the source electrode in a plan view of the field-effect transistor, the gate electrode having a first end and a second end in the first direction;
an insulating layer formed on the GaN-based stacked body so as to cover the gate electrode;
a gate electrode pad formed on the insulating layer;
a first wiring line arranged to electrically connect the first end of the gate electrode to the gate electrode pad; and
a second wiring line having a longer wiring length than the first wiring line and arranged to electrically connect the second end of the gate electrode to the gate electrode pad, wherein
the first wiring line includes an impedance adjusting portion and an impedance of the first wiring line including the impedance adjusting portion is substantially same as an impedance of the second wiring line.

2. The field-effect transistor according to claim 1, wherein the impedance adjusting portion is provided in a part of the first wiring line that extends in a longitudinal direction of the gate electrode.

3. The field-effect transistor according to claim 1, wherein the impedance adjusting portion is a resistance element.

4. The field-effect transistor according to claim 3, wherein the drain electrode, the source electrode, and the impedance adjusting portion are formed of ohmic metals.

5. The field-effect transistor according to claim 1, wherein a plurality of the drain electrodes and a plurality of the source electrodes are alternately disposed in substantially parallel with each other at intervals in the second direction and extend like fingers in the first direction.

6. The field-effect transistor according to claim 1, wherein the gate electrode pad is provided in a position closer to the first end than to the second end of the gate electrode with respect to the first direction.

7. The field-effect transistor according to claim 1, wherein the first and second wiring lines share a wiring line portion that includes a connection with the gate electrode pad.

8. A field-effect transistor comprising:

a GaN-based stacked body having a heterojunction;

a drain electrode that is formed on the GaN-based stacked body so as to extend in a first direction;

a source electrode that is formed on the GaN-based stacked body so as to extend in the first direction, with a predetermined interval left between the drain electrode and the source electrode in a second direction intersecting the first direction;

a gate electrode formed between the drain electrode and the source electrode in a plan view of the field-effect transistor, the gate electrode having a first end and a second end in the first direction;

an insulating layer formed on the GaN-based stacked body so as to cover the gate electrode;

a gate electrode pad formed on the insulating layer;

a first wiring line arranged to electrically connect the first end of the gate electrode to the gate electrode pad; and a second wiring line arranged to electrically connect the second end of the gate electrode to the gate electrode pad, wherein the gate electrode pad is provided in a position closer to the first end than to the second end of the gate electrode with respect to the first direction, the first and second wiring lines are joined to each other so as to share a wiring line portion that includes a connection with the gate electrode pad, and the first wiring line includes an impedance adjusting portion consisting of a meandering wiring line portion between the first end of the gate electrode and a joint between the first and second wiring lines, and an impedance of the first wiring line including the impedance adjusting portion is substantially same as an impedance of the second wiring line.

9. The field-effect transistor according to claim 8, wherein a plurality of the drain electrodes and a plurality of the source electrodes are alternately disposed in substantially parallel with each other at intervals in the second direction and extend like fingers in the first direction.

* * * * *